United States Patent [19]

Ablassmeier

[11] 4,139,782
[45] Feb. 13, 1979

[54] REGENERATOR STAGE FOR CCD ARRANGEMENTS

[75] Inventor: Ulrich Ablassmeier, Waltenhofen, Fed. Rep. of Germany

[73] Assignee: Siemens Aktiengesellschaft, Berlin and Munich, Fed. Rep. of Germany

[21] Appl. No.: 726,672

[22] Filed: Sep. 27, 1976

[30] Foreign Application Priority Data

Sep. 30, 1975 [DE] Fed. Rep. of Germany ....... 2543615

[51] Int. Cl.$^2$ .................. G11C 19/28; H01L 29/78
[52] U.S. Cl. ............................ 307/221 D; 357/24
[58] Field of Search ................... 357/24; 307/221 D

[56] References Cited

U.S. PATENT DOCUMENTS

| | | | |
|---|---|---|---|
| 3,758,794 | 9/1973 | Kosonocky | 357/24 |
| 3,986,198 | 10/1976 | Kosonocky | 357/24 |
| 4,010,484 | 3/1977 | Mohsen | 357/24 |
| 4,027,260 | 5/1977 | Carnes et al. | 357/24 |
| 4,028,715 | 6/1977 | Emmons | 357/24 |
| 4,034,199 | 7/1977 | Lampe et al. | 357/24 |
| 4,035,821 | 7/1977 | Gunsagar et al. | 357/24 |

OTHER PUBLICATIONS

Sequin et al., "Linearity of Electrical Charge Injection Into Charge Coupled Devices", IEEE J. Solid-State Circuits, vol. SC-10 (4/75), pp. 81-92.
Tao et al., "Sampled Analog CCD Recursive Comb Filters", Int. Conf. Application CCD's, San Diego, (10/75), pp. 257-266.
Tomsett, "Surface Potential Equilibration Method of Setting Charge in Charge Coupled Devices", IEEE Trans. Electron Devices, vol. ED-22 (6/75), pp. 305-309.
Emmons et al., "Noise Measurements on the Floating Diffusion Input for Charge Coupled Devices", J. Applied Physics, vol. 45 (12/74), pp. 5303-5306.

Primary Examiner—William D. Larkins
Assistant Examiner—Gene M. Munson
Attorney, Agent, or Firm—Hill, Gross, Simpson, Van Santen, Steadman, Chiara & Simpson

[57] ABSTRACT

A stage useful as either a differential amplifier or a regenerator for a charge coupled device is disclosed herein. The stage is arranged on a substrate for the charge coupled device and adjacent the pulsable electrodes of first and second planes of an electrical insulating layer over the substrate. The stage has a diffusion zone which is oppositely doped to the substrate. Adjacent the diffusion zone the first electrode is arranged in the first plane of the insulating layer. Adjacent the first electrode a large-area second electrode is arranged. Adjacent the second electrode a first plane third electrode, a second plane fourth electrode, and a first plane fifth electrode are arranged, a fifth electrode being positioned adjacent one of the pulsable electrodes of the charge coupled device.

13 Claims, 23 Drawing Figures

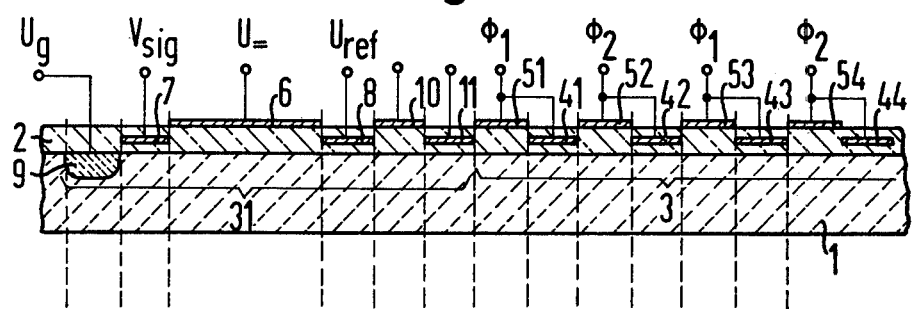
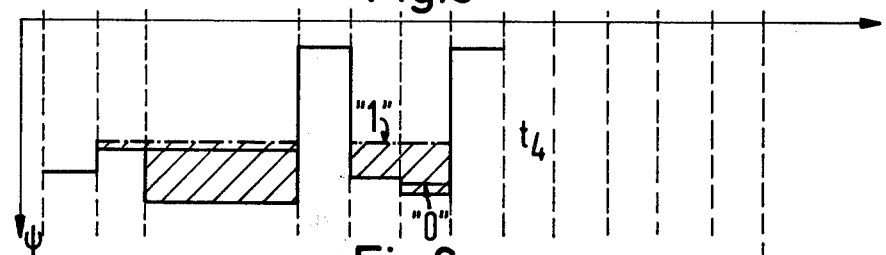
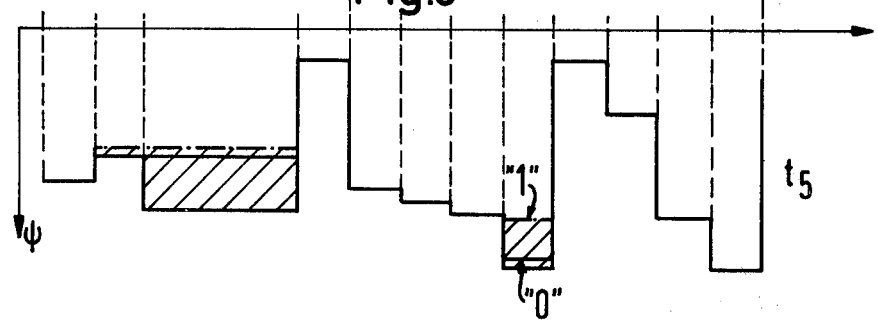

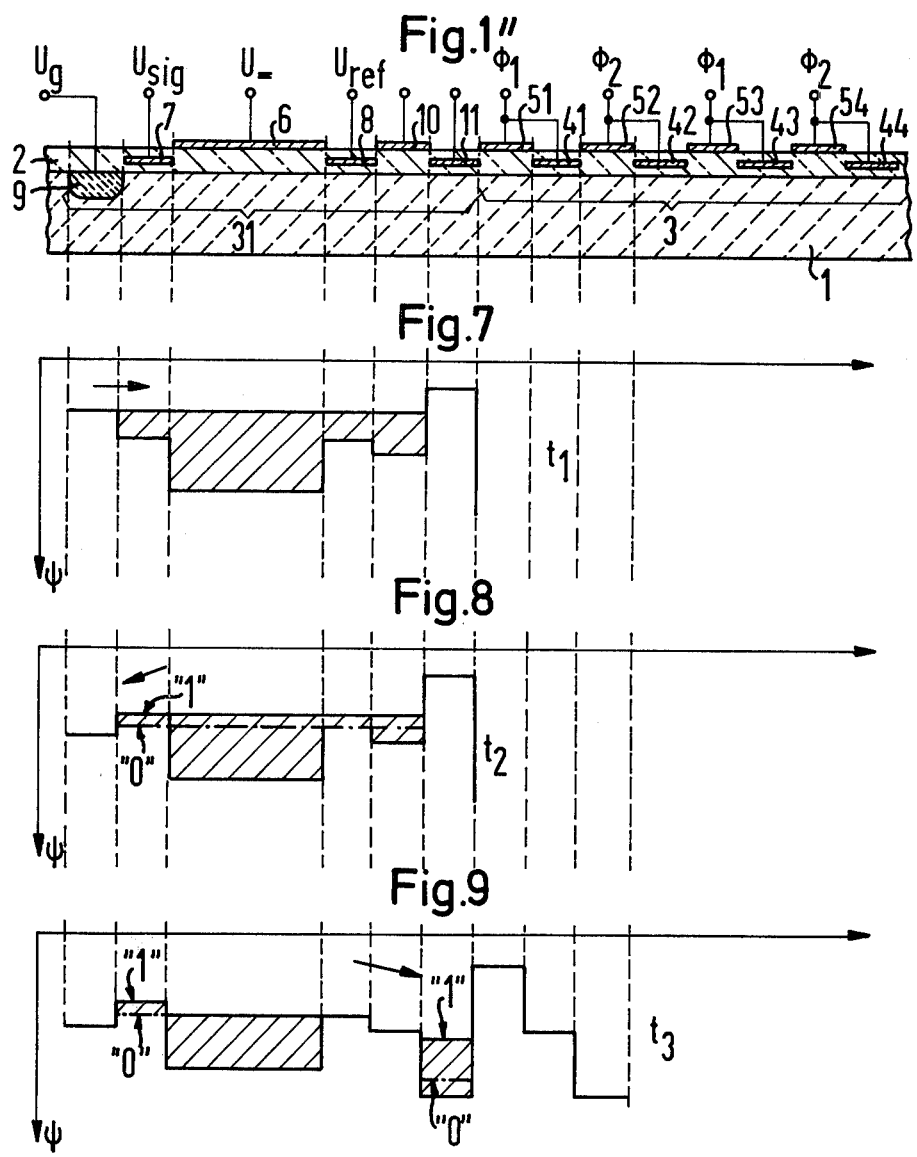

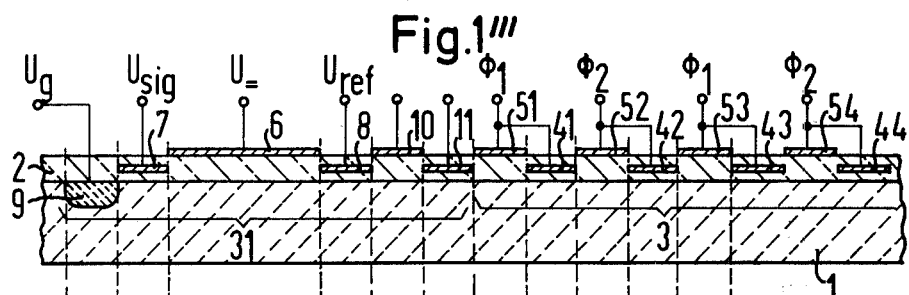
Fig.1'''
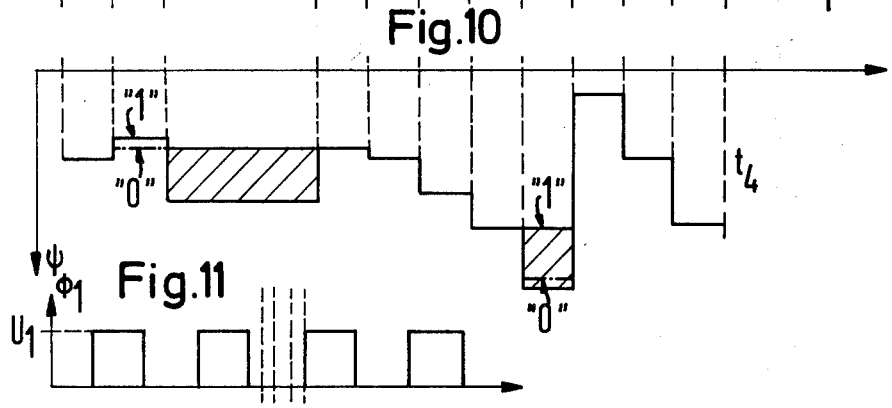
Fig.10
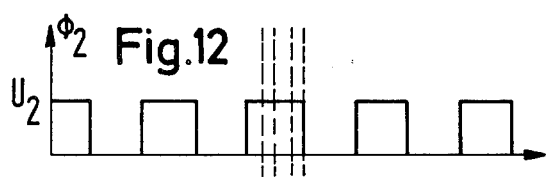
Fig.11
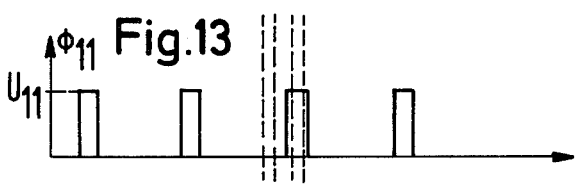
Fig.12
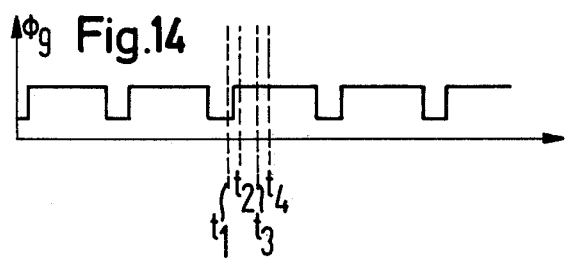
Fig.13
Fig.14

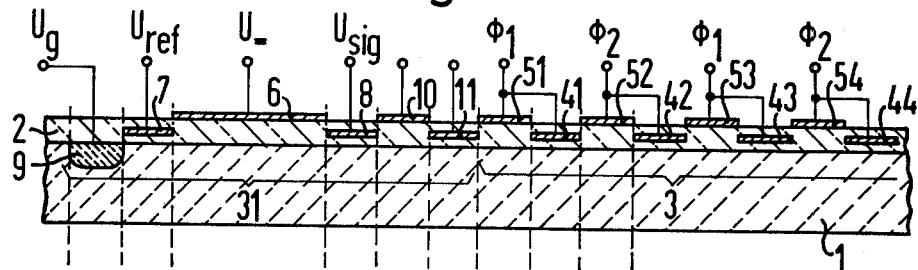
Fig. 1''''
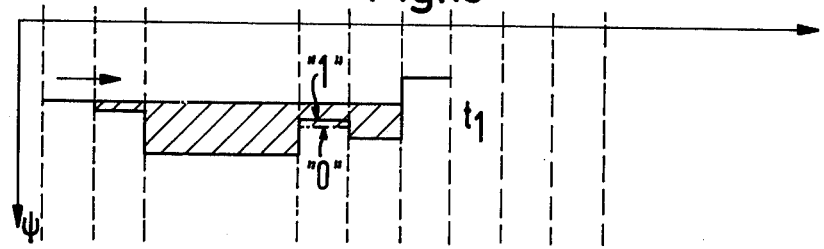
Fig. 15
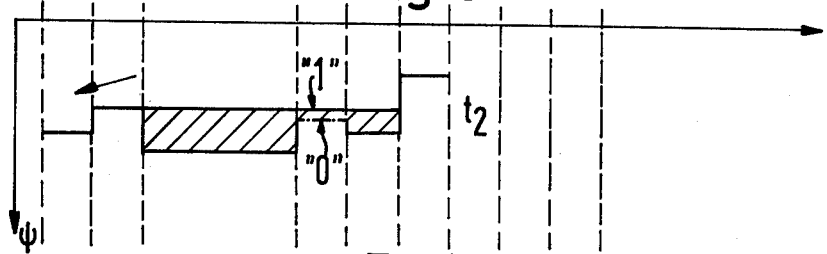
Fig. 16
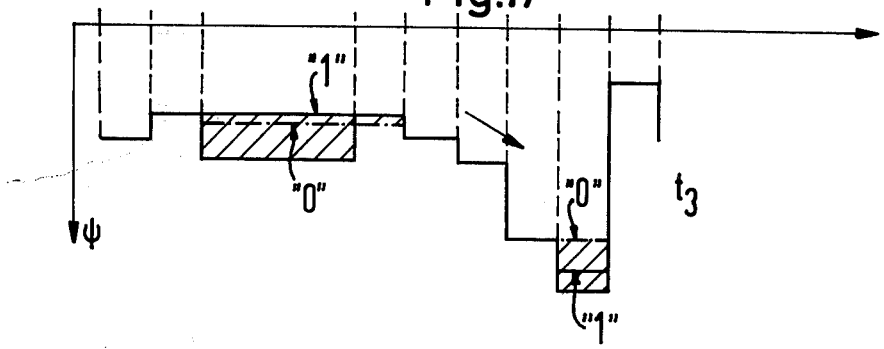
Fig. 17

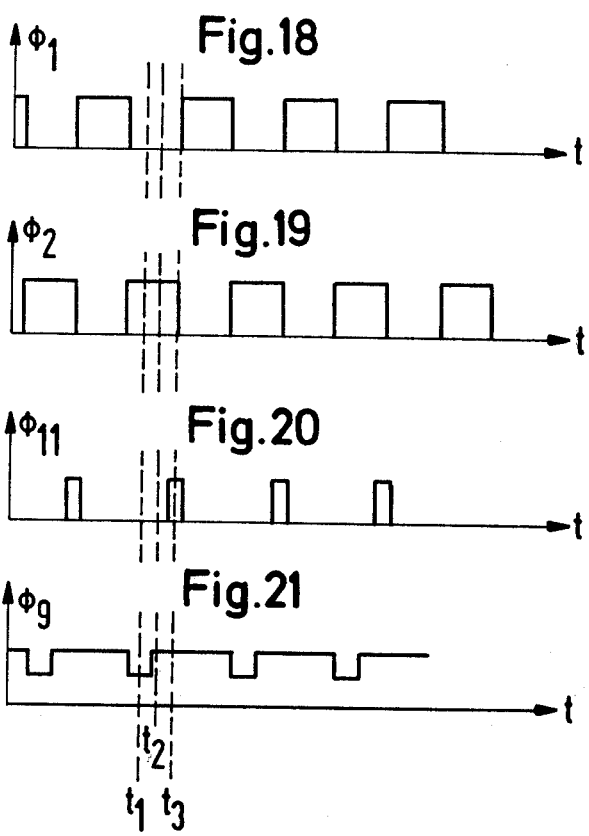

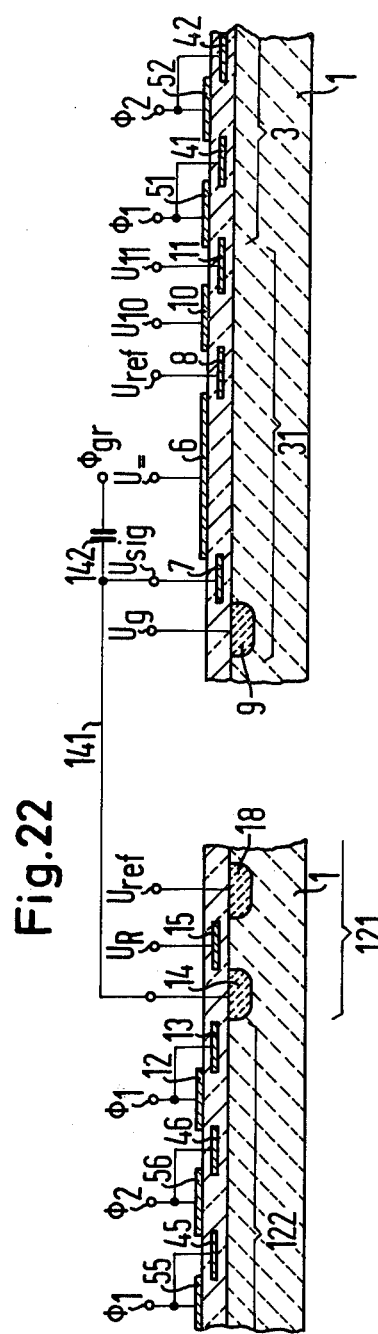
Fig.22
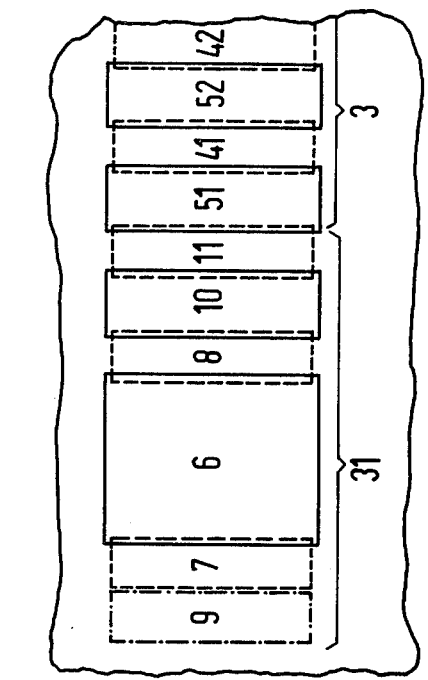
Fig.23
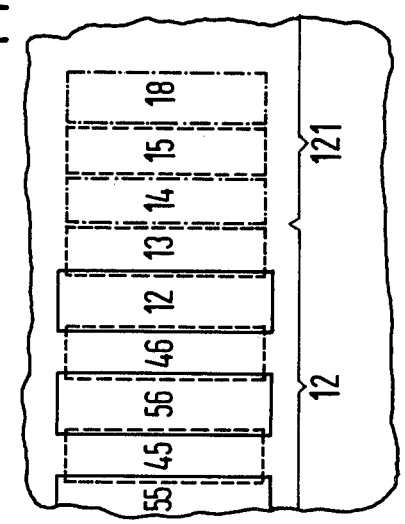

REGENERATOR STAGE FOR CCD ARRANGEMENTS

BACKGROUND OF THE INVENTION

1. Field of the Invention

This invention relates to a stage for charge coupled device (CCD) arrangements operated in accordance with the charge coupled device principle in which a substrate is provided having first and second plane pulsable electrodes in an insulating layer over the substrate.

2. Description of the Prior Art

CCD (charge coupled device) arrangements require regenerator stages which can unambiguously evaluate small voltage differences which arise at the output of a CCD stage. Known regenerator stages of this type for CCD arrangements are very sensitive to changes in the supply voltage and threshold voltages. A disadvantage of these circuits is that the supply voltages must continuously be readjusted, and therefore stable operation is possible only with difficulty.

A further problem of conventional regenerator circuits relates to the input of the basic charge required to achieve low losses. In known circuits, the basic charge is input by a brief opening of a control gate at the input. The pulse at this control gate must, however, be precisely adjuted with respect to time duration and amplitude. In particular, in the case of CCD arrangements with a plurality of regenerator stages, adjustment operations of this type rule out practical operation.

SUMMARY OF THE INVENTION

It is an object of the present invention to provide a regenerator stage in which the above described disadvantages are avoided.

This object is realized by a regenerator stage for CCD arrangements operating in accordance with the charge coupled device principle, which has a diffusion zone in the substrate which is oppositely doped into which a first potential is connected. In the first plane of an insulating layer over the substrate and next to the diffusion zone, a first electrode is arranged to which a signal voltage from the output stage of an adjacent CCD arrangement or a reference voltage can be connected. Next to the first electrode in the second plane is arranged a large-area, second electrode to which a second potential can be connected. Next to the second electrode in the first plane a third electrode is arranged for connection to a reference voltage or the signal voltage. Next to the third electrode in the second plane a fourth electrode is arranged for connection to a third potential. Next to the fourth electrode in the first plane a fifth electrode is arranged for connection to a fourth potential. The diffusion zone and electrodes of the stage are joined to the pulsable electrodes of the CCD. This stage may also be operated as a differential amplifier.

A fundamental advantage of the regenerator stage in accordance with the invention consists in that it is independent of fluctuations in threshold voltage in various wafers and various chips of a wafer. The arrangement of the reference voltage source quite close to the circuit loops facilitates a complete compensation of the fluctuation in threshold voltage.

Since in the invention all the electrodes are arranged in a row, the advantage results that the circuits can be closely arranged next to one another. This results in a small space requirement.

Advantageously the regenerator stage in accordance with the invention allows the input of a determinate amount of charge for signal production. Accordingly, there is no danger that too much charge is input. Also forerunner and follower charges cannot arise as a result of this effect.

Since the arrangement in accordance with the invention is constructed in the same way as a CCD without interposed diffusion zones, parasitic capacitances are largely avoided. This results since the circit in accordance with the invention has a higher speed than known circuits.

Another fundamental advantage of the invention is that the problem of the input of a determinate basic charge is solved by the regenerator stage of this invention.

Since the basic charge is input simultaneously with the signal, the regenerator stage of the invention operates at a very high speed.

BRIEF DESCRIPTION OF THE DRAWINGS

FIGS. 2 to 6 show the surface potentials existing during the operation of the stage of FIG. 1 as a regenerator;

FIGS. 7 to 10 show the surface potentials existing during the operation of the stage of FIG. 1 as a differential amplifier;

FIGS. 11 to 14 show the pulse train program for the operating mode corresponding to FIGS. 7 to 10;

FIGS. 15 to 17 show the surface potentials of another operation of the stage of FIG. 1 operating as a differential amplifier;

FIGS. 18 to 21 show the pulse train program for the operating mode corresponding to FIGS. 15 to 17.

FIG. 22 shows an interconnection of a CCD output stage and the regenerator circuit in accordance with the invention; and FIG. 23 is a plan view showing the layout of a stage in accordance with the invention for transmission of basic charge.

DESCRIPTION OF THE PREFERRED EMBODIMENTS

Figure 1:
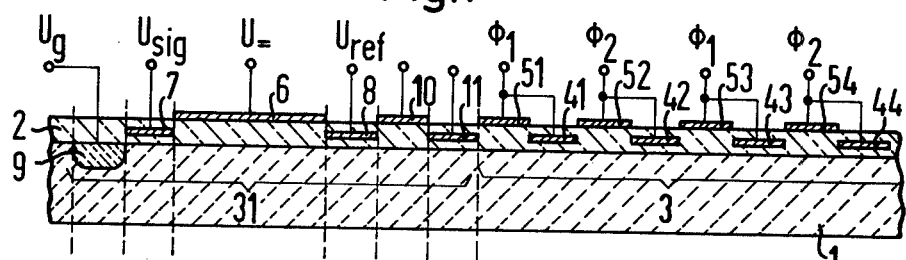
FIGS. 1, 1', 1'', 1''' and 1'''' schematically illustrates the input stage of a regenerator stage with transmission of basic charge in accordance with the invention.

FIG. 1 illustrates an input stage 31 of a regenerator circuit with basic charge in accordance with the invention. This input stage is joined, for example, by a two-phase CCD arrangement 3. Preferably both the input stage 31 and also the two-phase CCD 3 are arranged on a substrate 1 consisting of semiconducting material composed of silicon. Arranged on this substrate 1 is the electrical insulating layer 2, which preferably consists of $SiO_2$. In known prior art manner, the electrodes of the first plane of the two-phase CCD 3 are arranged on the electrical insulating layer 2. Here the electrodes of the first plane of the CCD arrangement 3 are referenced 41 to 44 and the electrodes of the second plane are referenced 51 to 54. In each case, one electrode of the second plane is electrically connected in known manner to an adjacent electrode of the first plane.

The input stage 31 in accordance with the invention consists of an input diffusion zone 9; an electrode 7 arranged next to the zone 9 for the connection of the signal voltage $U_{sig}$ from an output CCD; a large-area electrode 6 which is arranged next to the electrode 7; and electrodes 8, 10 and 11 arranged next to one another. For example, the electrodes 7, 8 and 11 are electrodes of the first plane, and the electrodes 6 and 10 are electrodes of the second plane.

As a result of self-adjusting diffusion by use of the electrode 7, parasitic capacitances between the diffusion zone 9 and the electrode 7 are avoided.

The electrode 6 of the input stage is always connected to a DC voltage $U_=$ which is always greater than the voltage across the adjacent electrodes 7 and 8. As can be seen from FIG. 1, the diffusion zone 9, which is oppositely doped to the substrate 1, is arranged in the substrate 1 next to the electrode 7.

Figure 2:
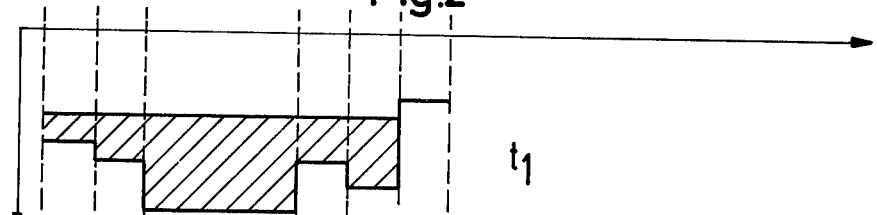
Figure 3:
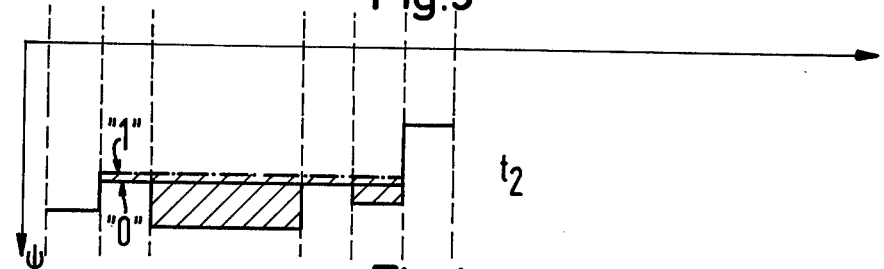
Figure 4:
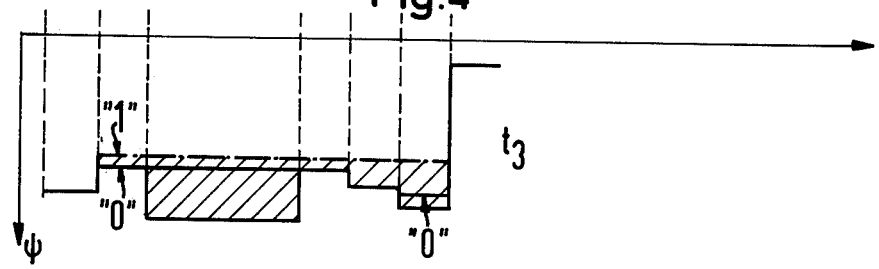

FIGS. 2 to 6 represent the surface potentials which are to occur under the individual electrodes of the input stage 31 and the CCD arrangement 3 for a first operating situation. At time $t_1$ (FIG. 2), the surface potential $\psi_{10}$ under the electrode 10 which is arranged next to the electrode 8, is somewhat greater than the surface potential $\psi_8$ below the electrode 8. At time $t_1$, the zone which is shaded in FIG. 2 is filled with charge from the diffusion zone 9, so that all the potential wells are filled. For this purpose the diffusion zone 9 is connected to the potential $\psi_9$. Then the preceding CCD arrangement which is not shown in FIG. 1 emits a signal $U_{sig}$ to the electrode 7. If this signal represents a digital "1," the surface potential $\psi_7$ beneath the electrode 7 increases and rises above the surface potential $\psi_8$ of the electrode 8 which latter is connected to a reference voltage $U_{ref}$. If the signal across the electrode 7 represents a digital "0," the potential $\psi_7$ beneath the electrode 7 does not rise above the surface potential $\psi_8$ of the electrode 8.

At time $t_2$ (FIG. 3), as a result of an increase in the voltage across the input diffusion zone 9, the excess charge is eliminated. When a digital "0" previously occurs, the surface potential takes the form of the solid line in FIG. 3, and in the case of a digital "1" takes the form of the dash-dotted line arranged above. The charge beneath the electrode 10 represents the basic charge which is transmitted in either case.

At time $t_3$ (FIG. 4), the voltage on the electrode 11 is increased, so that an additional potential well occurs beneath this electrode. Into this well flows the basic charge which previously existed below the electrode 10 and, when a digital "1" was previously transmitted, additional sufficient charge flows into the well so that the surface potential beneath the electrodes 6, 8, 10 and 11 is equal.

Then, at time $t_4$ (FIG. 5), the voltage of the electrode 8 is reduced, and thus the charge beneath the electrodes 10 and 11 is cut off.

At time $t_5$ (FIG. 6), the pulse train $\phi_1$ is connected to the electrodes 51 and 41. Here the amplitude of this pulse train is designed such that it is greater than the surface potential beneath the electrode 11. As a result, the charge is transferred into the CCD 3, where it is shifted in known manner.

At time $t_6$, the potentials corresponding to FIG. 2 are connected again, for which reason the arrangement is again ready to receive the next charge input.

By omitting the electrode 10, the arrangement shown in FIG. 1 can also be operated without basic charge. This results in the fact that the electrodes 7, 6 and 8 are each arranged in the other plane. In this case, the potential well represented in FIGS. 2 to 6 between the electrodes 8 and 11 would be omitted.

Below, a second operating mode of the stage in FIG. 1 operated as a differential amplifier will be described making reference to FIGS. 7 and 10. Here the signal voltage $U_{sig}$ is again connected to the electrode 7. The electrode 6 again acts as a storage capacitance and therefore is continuously connected to a DC voltage $U_{32}$. The rereference voltage $U_{ref}$ is connected to the electrode 8. The electrode 10 serves for the input of the basic charge and the electrode 11 serves to advance the charge. Here we have $\psi_6 > \psi_7$, $\psi_8$ and $\psi_{ref} \simeq \psi_{sig} > \psi_9 > \psi_{11}$ and $\psi_{10} > \psi_8$.

At time $t_1$ (FIG. 7), the potential wells beneath the electrodes 7, 8 and 10 are charged to the potential $\psi_9$ of the input diffusion zone 9.

At time $t_2$ (FIG. 8), the signal $U_{sig}$ has arrived at the electrode 7, whereupon the voltage $U_g$ of the input diffusion zone 9 is increased, so that we have $\psi_{sig} < \psi_g$. As a result, the entire excess charge beneath the electrodes 7, 6, 8 and 10 which exceeds the potential of the electrode 7 is sucked away by the input diffusion zone 9.

Depending upon whether the information "1" or "0" has arrived at time $t_2$, as can be seen from FIG. 8 more or less charge remains beneath the electrodes 6, 8 and 10. In the case of a binary "0," no charge remains beneath the electrode 8 when $U_{sig"0"} = U_{ref}$.

At time $t_3$ (FIG. 9) with the aid of the pulse train $U_{11}$, a voltage of greater magnitude is connected to the electrode 11. In the case of a binary "0" it is thus possible for the basic charge located beneath the electrode 10 to flow underneath the electrode 11. In the case of a binary "1," additional further charge flows from the electrodes 6 and 8 beneath the electrode 11 when the potential beneath the electrode 8 was greater than beneath the electrode 7. Then charge flows under the electrode 11 until the surface potential beneath the electrode 6 is equal to the surface potential beneath the electrode 8. This input charge is then $$Q_{"1"} = (\psi_8 - \psi_7) \cdot (C_6 + C_8) + (\psi_{10} - \psi_8) \cdot C_{10}$$

where $\psi_n$ = surface potential beneath the electrode n
$C_n$ = capacitance of the electrode n.

For $Q_{"0"}$ we have:

$$Q_{"0"} = (\psi_{10} - \psi_8) C_{10}.$$

As the input charge must be received from the CCD, the maximum input charge must not be greater than $$Q_{max} = (\psi_{42} - \psi_{52}) \cdot C_{42}$$

At time $t_4$ (FIG. 10), the transmitted charge is received by the CCD.

The input quantity of charge can be matched to the required voltages by varying the capacitances $C_6$ and $C_{10}$ in the design. The differential amplifier input stage of the invention, even with small voltages at the input, permits the input of a determinate charge, both basic charge and signal charge. In the described operating situations 1 and 2, the differential amplifier input of the invention does not have an inverting effect. The reference voltage must be greater than or equal to the signal voltage.

FIGS. 11 to 14 represent the individual pulse trains $\phi_1$, $\phi_2$, $\phi_9$ and $\phi_{11}$ versus time for the above described second operating mode.

A third operating mode of the stage in accordance with the invention is represented in FIGS. 15 to 17. Here, the reference voltage is connected to the electrode 7 and the signal voltage is connected to the electrode 8.

At time $t_1$, (FIG. 15) the electrodes 7 to 10 are overfilled with charge from the diffusion zone 9, whereas shortly before or after the information from the CCD output circuit is fed to the electrode 8. At the time $t_1$ we have:

$\psi_6 > \psi_7$, $\psi_8$ and $\psi_{10} > \psi_7 > \psi_9$

As can be seen from FIG. 15, in accordance with the information "1" or "0" which has arrived, a smaller or a larger potential threshold occurs beneath the electrode 8.

At time $t_2$ (FIG. 16) the excess charge is sucked away until the surface potential beneath the electrodes 6 to 10 is equal to the surface potential beneath the electrode 7. To this end, the potential $\psi_9$ is rendered greater than the potential $\psi_7$.

At time $t_3$ (FIG. 17), with the aid of the pulse train $\phi_{11}$, the surface potential of the electrode 11 is increased. Thus, the basic charge which is stored under the electrode 10 can be transferred to beneath the electrode 41. If the signal which was connected to the electrode 8 was a "1," the surface potential beneath the electrode 8 is equal to the reference potential beneath the electrode 7 and no additional charge flows from the electrode 6 to the electrode 41. If, however, the signal connected to the electrode 8 was a "0," the surface potential beneath the electrode 8 is greater and charge can flow from the electrode 6 to the electrode 41. In this operating situation, the differential amplifier input has an inverting action. The reference voltage must be smaller than or equal to the signal voltage.

FIGS. 18 to 21 represent the pulse train program for the above-described third operating situation.

FIG. 22 illustrates the entire regenerator circuit in accordance with the invention. Here the right-hand part of the circuit corresponds to the circuit represented in FIG. 1. Details of FIG. 22 which have already been represented in association with FIG. 1 bear the corresponding references. The left-hand part of the circuit illustrated in FIG. 22 consists of a CCD stage 122 and of an output stage 121 known per se and connected thereto. Here the output stage consists of the electrode 12 of the second plane and of the electrodes 13 and 15 of the first plane. The electrode 13 is adjacent the electrode 12. The electrode 13 is adjacent the diffusion zone 14. The electrode 15 is adjacent the diffusion zone 14. The diffusion zone 18 is adjacent the electrode 15. The signal voltage is tapped from the output diffusion zone 14. For this purpose, the diffusion zone 14 of the output stage is connected via the line 141, which is connected to the electrode 7 of the regenerator stage of the invention. The function of an output stage of this type is known.

As a basic charge is transmitted, and also when a logic "0" is transmitted, charge occurs in the output diffusion zone 14. This charge would continuously increase the signal voltage and thus lead to an indeterminate charge transmission. To prevent this effect, a pulse train $\phi_{gr}$ is connected to a coupling capacitance 142 which is connected to the line 141 in the manner shown in the Figure. As a result of this coupling, the signal voltage $U_{sig}$ is biased to a value which is such that on the arrival of a logic "0," only basic charge is forwarded from the regenerator stage.

Preferably the described regenerator stage in accordance with the invention does not have an inverting effect. As it only transmits a difference charge, it is independent of start voltages and insensitive to smaller fluctuations in the supply voltage.

FIG. 23 represents the design of a regenerator circuit in accordance with the invention corresponding to FIG. 22. Preferably the regenerator circuit in accordance with the invention is constructed in an aluminium-silicon-gate technique. Details of FIG. 23 which have already been described in association with FIG. 22, bear the corresponding references. Here, areas shown in solid lines are aluminium electrodes, areas shown in broken lines are silicon electrodes and areas shown in dash-dotted lines are diffusion zones. For the sake of simplicity, aluminium conductor paths have not been represented.

From FIG. 23 it can be seen that the regenerator circuit in accordance with the invention requires only a small amount of space.

In the regenerator circuit of the invention, the electrode 6 advantageously carries a DC voltage potential. In the invention, modulation of the size of the storage surface by boundary fields is avoided as the changes in voltage between adjacent electrodes are small. Finally, the electrodes 7 and 8 which control the input of the charge are of the same type, and consist, for example, of polysilicon. These three above-mentioned advantages, which are described as important for a good linearity by Sequin and Mohsen in the publication "Linearity of Electrical Charge Injection into Charge-Coupled Devices," IEEE Journal of Solid-State Circuits, April 1975, also result in a good linearity for the regenerator stage in accordance with the invention.

In addition, the linearity can be further increased in that the electrode 6 is made considerably larger than the other electrodes so the influences of the voltage differences in accordance with condition 2 have a relatively slight effect. At the same time, with such an embodiment, advantageously small voltage differences occur in the input.

For example, the surface of the electrode 6 is approximately 3 to 5 times as large as the surface of the electrode 11.

The coupling with the aid of the pulse train $\phi_{gr}$ can also be provided, not to the signal voltage $U_{sig}$, but to the reference voltage $U_{ref}$.

FIGS. 1', 1'' and 1''' correspond to FIG. 1 and have been represented several times merely to illustrate the various surface potential sources in order to ensure a better correlation of these potential paths to the individual electrodes. The same applies to FIG. 1''''. In the arrangement corresponding to this Figure, however, the voltages $U_{sig}$ and $U_{ref}$ are exchanged in comparison to the arrangement shown in FIG. 1.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A stage for charge-coupled device arrangements having an electrical insulating layer applied to a substrate comprised of semiconductor material, pulsable electrodes of a first plane and pulsable electrodes of a second plane being provided over the substrate and which are electrically isolated from one another by the electrical insulating layer, electrodes of the first plane being separated from the substrate by less thick portions of the insulating layer than are the electrodes of the second plane, comprising:

(a) a diffusion zone in the substrate which is of opposite conductivity type as compared to the semiconductor substrate of a given conductivity type, and a first potential connected to said diffusion zone;

(b) in the first plane next to said diffusion zone a first electrode being arranged, and a signal voltage from an output stage of a charge coupled device arrangement connected to the first electrode;

(c) next to the first electrode in the second plane a largearea, second electrode of area larger than the first electrode being arranged, and a second constant potential connected to the second electrode;

(d) next to the second electrode in the first plane a third electrode being arranged, and a reference voltage connected to the third electrode;

(e) next to the third electrode in the second plane a fourth electrode being arranged, and a third constant potential connected to the fourth electrode;

(f) next to the fourth electrode in the first plane a fifth electrode being arranged, and a fourth potential connected to the fifth electrode; and (g) the diffusion zone and electrodes of the stage being located near said pulsable electrodes.

2. The stage of claim 1, characterized in that the first electrode of the stage connects via a line to an output diffusion zone of an output stage of another charge coupled device.

3. The stage of claim 2, characterized in that said line is connected to an electrode of a capacitor and that a pulse train can be connected to the other electrode of the capacitor.

4. The stage of claim 1, characterized in that the substrate consists of silicon.

5. The stage as claimed in claim 1, characterized in that the electrical insulating layer consists of $SiO_2$.

6. The stage of claim 1, characterized in that the electrodes of the first plane consist of silicon.

7. The stage of claim 1, characterized in that the electrodes of the second plane consist of aluminum.

8. The stage of claim 1, characterized in that the area of the second electrode is approximately 3 to 5 times as great as the area of the fifth electrode.

9. A charge coupled device comprising:

(a) an electrical insulating layer applied to a semiconductor substrate of a given conductivity type;

(b) charge coupled device pulsable electrodes in first and second parallel planes of the insulating layer;

(c) a stage functioning as either a regenerator or differential amplifier comprising:

(i) a diffusion zone in the substrate of opposite conductivity type as compared to the substrate and having a connection terminal;

(ii) a first electrode in the first plane of the insulating layer and adjacent the diffusion zone;

(iii) a second electrode in the second plane of area larger than other electrodes in the second plane and adjacent the first electrode;

(iv) a third electrode in the first plane and adjacent the second electrode;

(v) a fourth electrode in the second plane and adjacent the third electrode; and (vi) a fifth electrode in the first plane and adjacent the fourth electrode;

(d) the fifth electrode being arranged between the fourth electrode of said stage and the charge coupled device pulsable electrodes; and (e) one of the first and third electrodes connecting with a signal voltage source and the other to a reference voltage source, the third and fifth electrodes each connecting with a separate potential source, and the second and fourth electrodes connecting to constant separate potential sources.

10. A stage for charge-coupled device arrangements having an electrical insulating layer applied to a substrate of given conductivity type comprised of semiconductor material, pulsable electrodes of a first plane and pulsable electrodes of a second plane being provided over the substrate and which are electrically isolated from one another by the electrical insulating layer, electrodes of the first plane being separated from the substrate by less thick portions of the insulating layer than are the electrodes of the second plane, comprising:

(a) a diffusion zone in the substrate which is of opposite conductivity type as compared to the semiconductor substrate, and a first potential connected to said diffusion zone;

(b) in the first plane next to said diffusion zone a first electrode being arranged, and a reference voltage connected to the first electrode;

(c) next to the first electrode in the second plane a large-area, second electrode of area larger than the first electrode being arranged, a second constant potential connected to the second electrode;

(d) next to the second electrode in the first plane a third electrode being arranged, a signal voltage connected to the third electrode;

(e) next to the third electrode in the second plane a fourth electrode being arranged, a third constant potential connected to the fourth electrode;

(f) next to the fourth electrode in the first plane a fifth electrode being arranged, a fourth potential connected to the fifth electrode; and (g) the diffusion zone and electrodes of the stage being located near said pulsable electrodes.

11. A method of operating a stage as a regenerator for an adjacent charge coupled device, said stage having first, second, third, fourth and fifth electrodes over and electrically isolated from a semiconductor substrate of a given conductivity type by an electrical insulating layer on the substrate, and a diffusion zone in the substrate of opposite conductivity type as compared to the substrate, and said charge coupled device having first electrodes connected to pulse train lines, comprising the steps of (a) at a first time period, connecting the second electrode of the stage to a second voltage, this second voltage being designed such that it is always greater than the voltage across the adjacent first electrode and adjacent third electrode, the first electrode being connected to a signal voltage and the third electrode being connected to a reference voltage, a fifth electrode having a fourth voltage connected thereto, connecting a third voltage to the fourth electrode so that a surface potential beneath the fourth electrode is greater than a surface potential beneath the third electrode and beneath the fifth electrode as the result of which between the surface potentials under the first and third electrodes a potential well is formed beneath the second electrode, and that between the surface potential beneath the third electrode and the fifth electrode a potential well is likewise formed beneath the fourth electrode, and that a first voltage is connected to the diffusion zone which provides a surface potential in the diffusion zone which is greater than the surface potential beneath the fifth electrode but smaller than the surface potential beneath the first and third electrodes, as the result of which all the potential wells beneath the diffusion zone, the first electrode, the second electrode, the third electrode and the fourth electrode are filled with charge carriers from the diffusion zone, that the first electrode is connected to the input signal voltage such that the surface potential beneath the first electrode reduces when the signal is a digital "1" and becomes smaller than the surface potential beneath the third electrode produced as a result of the reference voltage, and where the surface potential beneath the first electrode does not rise above the surface potential beneath the third electrode when the information represents a digital "0;"

(b) at a second time period increasing the first voltage connected to the input diffusion zone such that the surface potential in the diffusion zone is greater than beneath the first electrode, such that all the excess charges are removed from the potential wells beneath the first, second, third and fourth electrodes, the amount of the excess charges beneath the second, third and fourth electrodes being determined by the signal voltage connected to the first electrode and which represents either a binary "1" or a binary "0;" and (c) at a third time period increasing the fourth voltage on the fifth electrode such that beneath the fifth electrode an additional potential well forms which, in accordance with the signal voltage, is filled to varying levels;

(d) at a fourth time period reducing the reference voltage connected to the third electrode; and (e) at a fifth time period applying voltages from the pulse train line to the first electrodes of said adjacent charge coupled device, said voltages being greater than the fourth voltage on the fifth electrode so that charge from the potential well beneath the fourth electrode and fifth electrode is transferred into the charge coupled device.

12. A method of operating a stage as a differential amplifier for a charge coupled device, said stage having first, second, third, fourth, and fifth electrodes over and electrically isolated from a semiconductor substrate of a given conductivity type by an electrical insulating layer on the substrate, and a diffusion zone in the substrate of opposite conductivity type as compared to the substrate, comprising the steps of:

(a) connecting the second electrode of the stage to a second voltage chosen such that it is always greater than a voltage across the adjacent first and third electrodes, connecting the first electrode to a signal voltage and the third electrode to a reference voltage, providing the diffusion zone with a surface potential smaller than the surface potential beneath the third electrode, providing a surface potential beneath the fourth electrode which is greater than the surface potential beneath the third electrode, and providing a surface potential beneath the fifth electrode which is smaller than the surface potential in the diffusion zone and a surface potential beneath the fourth electrode;

(b) at a first time period connecting the diffusion zone to a first voltage so that potential wells beneath the first electrode, second electrode, third electrode and fourth electrode are filled with charge carriers from the diffusion zone, a surface potential beneath the third electrode in the case of a binary "1" arising at the first electrode being greater than the surface potential beneath the first electrode, and, in the case of a binary "0" arriving at the first electrode, a surface potential beneath the third electrode being equal to the surface potential beneath the first electrode;

(c) at a second time period, making the surface potential of the diffusion zone greater than the surface potential beneath the first electrode after the arrival of the binary information "1" or "0" at the first electrode;

(d) at a third time period, making the surface potential beneath the fifth electrode larger than the surface potential beneath the fourth electrode so that beneath the fifth electrode a potential well is formed in which a different quantity of charge is accomulated depending upon the information "1" or "0" arriving at the first electrode; and (e) feeding the charge in the potential well beneath the fifth electrode to the charge coupled device as the result of the potential drop produced during the third time period.

13. Method of operating a stage as a differential amplifier for a charge coupled device, said stage having first, second, third, fourth and fifth electrodes over and electrically isolated from a semiconductor substrate of a given conductivity type by an electrical insulating layer on the substrate, and a diffusion zone in the substrate of opposite conductivity type as compared to the substrate, comprising the steps of:

(a) at a first time period, connecting a second electrode of the stage to a second voltage, said second voltage being chosen such that it is always greater than the voltage across adjacent first and third electrodes, connecting the first electrode to a reference voltage and the third electrode to a signal voltage, these voltages being chosen such that beneath the second electrode a potential is formed which is greater than the potentials beneath the first and third electrodes, providing a potential beneath the fourth electrode which is greater than the potential beneath the third electrode, providing a potential beneath the first electrode which is greater than a potential beneath the diffusion zone, and that depending upon the signal voltage connected to the third electrode such as a binary "1" the potential beneath the first electrode is equal to the potential beneath the third electrode or in the case of a binary "0" the potential beneath the first electrode is smaller than the potential beneath the third electrode, providing a potential in the diffusion zone which is smaller than the potential beneath the first electrode, and providing a potential beneath the fifth electrode which is smaller than the potential across the diffusion zone;

(b) at a second time period making the potential across the diffusion zone greater than the potential beneath the first electrode after the arrival of the signal voltage at the third electrode and after the potential wells have been filled with charge carriers; and (c) at a third time period making the potential beneath the fifth electrode greater than the potential beneath the fourth electrode so that the quantity of charge of the potential well beneath the fifth electrode which has accumulated in accordance with the signal "1" or "0" of the third electrode shifts in the direction towards the charge coupled device and is pulsed onwards by the charge coupled device.

* * * * *